United States Patent
Kim et al.

(10) Patent No.: US 9,169,409 B2
(45) Date of Patent: Oct. 27, 2015

(54) INK COMPOSITION FOR IMPRINT LITHOGRAPHY AND ROLL PRINTING

(71) Applicant: LG Display Co., Ltd., Seoul (KR)

(72) Inventors: Sung-Hee Kim, Gyeonggi-Do (KR);
Soon-Sung Yoo, Gyeonggi-Do (KR);
Jin-Wuk Kim, Gyeonggi-Do (KR);
Byung-Geol Kim, Gyeonggi-Do (KR);
Byung-Uk Kim, Gyeonggi-Do (KR);
Ki-Beom Lee, Gyeonggi-Do (KR);
Byong-Hoo Kim, Gyeonggi-Do (KR);
Seung-Hyup Shin, Gyeonggi-Do (KR);
Jun-Yong Song, Gyeonggi-Do (KR);
Myoung-Soo Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/532,186

(22) Filed: Nov. 4, 2014

(65) Prior Publication Data

US 2015/0133582 A1    May 14, 2015

Related U.S. Application Data

(60) Continuation-in-part of application No. 13/090,895, filed on Apr. 20, 2011, which is a division of application No. 12/613,961, filed on Nov. 6, 2009, now Pat. No. 7,935,552.

(30) Foreign Application Priority Data

Nov. 7, 2008  (KR) ........................ 10-2008-0110624

(51) Int. Cl.
| | |
|---|---|
| *C09D 11/00* | (2014.01) |
| *C09D 11/103* | (2014.01) |
| *C08K 5/134* | (2006.01) |
| *C08K 5/3492* | (2006.01) |
| *C08K 11/00* | (2006.01) |
| *C08K 5/05* | (2006.01) |
| *B82Y 10/00* | (2011.01) |
| *B82Y 40/00* | (2011.01) |
| *C09D 11/02* | (2014.01) |
| *C09D 11/033* | (2014.01) |
| *G03F 7/00* | (2006.01) |

(52) U.S. Cl.
CPC ............. *C09D 11/103* (2013.01); *B82Y 10/00* (2013.01); *B82Y 40/00* (2013.01); *C08K 5/05* (2013.01); *C08K 5/1345* (2013.01); *C08K 5/34922* (2013.01); *C08K 11/00* (2013.01); *C09D 11/02* (2013.01); *C09D 11/033* (2013.01); *G03F 7/0002* (2013.01)

(58) Field of Classification Search
CPC .... C09D 11/033; C09D 11/02; C08K 5/1345; C08K 5/34922; C08K 5/05
USPC ........................................................ 523/160
See application file for complete search history.

(56) References Cited

U.S. PATENT DOCUMENTS

| | | | | |
|---|---|---|---|---|
| 3,923,721 | A | * 12/1975 | Edwards et al. | ............... 523/443 |
| 4,060,262 | A | * 11/1977 | Maierson | ....................... 503/201 |
| 4,166,872 | A |   9/1979 | Karpik et al. | |
| 5,597,855 | A |   1/1997 | Giroldini et al. | |
| 6,517,619 | B1 |   2/2003 | Nowak et al. | |
| 7,714,978 | B2 |   5/2010 | Kim et al. | |
| 2004/0257416 | A1 | * 12/2004 | Kim et al. | ..................... 347/100 |
| 2004/0257516 | A1 |   12/2004 | Sugimoto et al. | |
| 2007/0048448 | A1 |   3/2007 | Kim et al. | |
| 2007/0131124 | A1 |   6/2007 | Heo et al. | |
| 2007/0153218 | A1 |   7/2007 | Kim et al. | |
| 2007/0178237 | A1 |   8/2007 | Shin et al. | |
| 2007/0188696 | A1 |   8/2007 | Kim et al. | |
| 2009/0176936 | A1 | * 7/2009 | Kim et al. | ....................... 525/50 |
| 2010/0120181 | A1 |   5/2010 | Kim et al. | |

FOREIGN PATENT DOCUMENTS

| | | |
|---|---|---|
| CN | 1564966 A | 1/2005 |
| CN | 101457050 A | 6/2009 |
| JP | 2-265978 | 10/1990 |
| JP | 11-246812 | 9/1999 |
| JP | 2001-72901 A | 3/2001 |
| JP | 2001-123084 A | 5/2001 |
| JP | 2001-164168 A | 6/2001 |
| JP | 2003-165940 A | 6/2003 |
| JP | 2003-221543 A | 8/2003 |
| JP | 2004-506807 A | 3/2004 |
| JP | 2005-239924 A | 9/2005 |
| JP | 2006-282680 A | 10/2006 |

(Continued)

OTHER PUBLICATIONS

Office Action from Taiwan Patent Office dated Nov. 16, 2012, in counterpart Taiwan Patent Application No. 098137764.

Notification of the Third Office Action dated Mar. 12, 2013 from the State Intellectual Property of the People's Republic of China in counterpart Chinese Patent Application No. 2009102208111.

Office Action dated Apr. 30, 2013 from the Korean Patent Office in counterpart Korean application No. 10-2008-0110624.

(Continued)

*Primary Examiner* — Alexander Kollias

(74) *Attorney, Agent, or Firm* — Morgan, Lewis & Bockius LLP

(57) ABSTRACT

Disclosed are an ink composition for an imprint lithography and a roll printing, wherein in forming patterns of the LCD device using the imprint lithography and the roll printing, an ink composition with high thermal resistance, consisting of polymer resin and additive both endurable even at a high temperature is used to form fine patterns with constantly maintaining pattern linewidths and line intervals, and wherein the ink composition is endurable even at a high temperature of 90-250° C.

3 Claims, 7 Drawing Sheets

(56) References Cited

FOREIGN PATENT DOCUMENTS

| | | |
|---|---|---|
| JP | 2007-23393 A | 2/2007 |
| JP | 2007-160921 A | 6/2007 |
| JP | 2007-219494 A | 8/2007 |
| JP | 2008-084984 A | 4/2008 |
| JP | 2008-525222 A | 7/2008 |
| JP | 2008-532309 A | 8/2008 |
| KR | 10-2007-0032220 A | 3/2007 |
| KR | 10-2008-0002517 A | 1/2008 |
| KR | 10-2008-0057951 A | 6/2008 |
| WO | 03/038525 A1 | 5/2005 |
| WO | 2007/110924 A1 | 4/2007 |

OTHER PUBLICATIONS

Office Action from the Japanese Patent Office dated May 8, 2012 in Japanese counterpart application.

Office Action dated Jun. 25, 2013 from the Japanese Patent Office in counterpart Japanese application No. 2009-255224.

* cited by examiner

FIG. 2

| CATEGORY | FIRST EMBODIMENT | SECOND EMBODIMENT | FIRST COMPARISON | SECOND COMPARISON |
|---|---|---|---|---|
| POLYMER RESIN | 10.0 | 10.0 | 10.0 | 10.0 |
| ADDITIVE | 10.0 | 10.0 | 10.0 | 10.0 |
| ORGANIC SOLVENT | 80.0 | 80.0 | 80.0 | 80.0 |
| SURFACTANT | 1.0 | 1.0 | 1.0 | 1.0 |
| ADHESIVE SENSITIZER AND VISIBLE COMPOUND | 3.0 | 3.0 | 3.0 | 3.0 |

FIG. 3

| CATEGORY | FIRST EMBODIMENT | SECOND EMBODIMENT | FIRST COMPARISON | FIRST COMPARISON |
|---|---|---|---|---|
| PATTERN TRANSCRIPTION RATE(%) | 98 | 97 | 85 | 79 |

INK COMPOSITION FOR IMPRINT LITHOGRAPHY AND ROLL PRINTING

BACKGROUND OF THE INVENTION

1. Field of the Invention

The present invention relates to ink composition, and particularly, to an ink composition with high heat resistance for imprint lithography and roll printing, capable of forming accurate fine patterns.

2. Background of the Invention

Recently, as information displaying becomes more attractive and demands on the use of portable information media increase, studies and commercialization of lighter, thinner flat panel displays (FPDs), substituting a cathode ray tube (CRT) as the existing display device, have been broadly conducted. Especially, among the FPDs, a liquid crystal display (LCD) device is to display images by using optical anisotropic property of liquid crystal. The LCD device is excellent in resolution, color rendering property, image quality and the like, and thus widely being applied to notebooks, desktop monitors and the like.

The LCD device includes a color filter substrate, an array substrate, and a liquid crystal layer interposed between the color filter substrate and the array substrate.

An active matrix method, which is a normally used driving method in the LCD device, is configured to drive liquid crystal of pixel units by employing amorphous silicon thin film transistors (a-Si TFTs) as switching devices.

Hereinafter, a structure of a related art LCD device will be described in detail with reference to FIG. 1.

FIG. 1 is a disassembled perspective view schematically showing a related art LCD device.

As shown in FIG. 1, the LCD device includes a color filter substrate 5, an array substrate 10, and a liquid crystal layer 30 interposed between the color filter substrate 5 and the array substrate 10.

The color filter substrate 5 is provided with a color filter C having a plurality of sub color filters 7 for rendering red (R), green (G) and blue (B) colors, a black matrix 6 for dividing between adjacent sub color filters 7 and blocking light transmitted through the liquid crystal layer 30, and a transparent common electrode 8 for applying a voltage to the liquid crystal layer 30.

Also, the array substrate 10 is provided with a plurality of gate lines 16 and data lines 17 arranged in horizontal and vertical directions for defining a plurality of pixel regions P, thin film transistor T as switching devices formed at intersections between the gate lines 16 and the data lines 17, and pixel regions 18 formed on the respective pixel regions P.

The color filter substrate 5 and the array substrate 10 having such structure are attached to face each other by a sealant (not shown) formed at an outer periphery of an image display region, thereby constructing an LCD panel. The attachment between the color filter substrate 5 and the array substrate 10 may be implemented by an attachment key (not shown) formed either at the color filter substrate 5 or at the array substrate 10.

The fabrication of the LCD device includes plural times of a photolithography process required to produce the array substrate having TFTs.

Also, for forming fine patterns, which are applied to information storage, compact sensors, photonic crystal and optical elements, micro-electro mechanical systems, display devices and semiconductors, the photolithography process conducted to form fine patterns using light is performed.

The photolithography process denotes a series of processes by which patterns printed on a mask are transferred on a thin film-deposited substrate so as to form desired patterns. The photolithography process is implemented through a plurality of complicated processes including photoresist coating, alignment and exposure, development and the like.

First, after coating photoresist as a photo resistor on a thin film on which preset patterns are to be formed, a pattern-formed photomask is aligned with the thin film and then exposed to light. Here, the photomask used is divided into a preset transparent region and a blocking region. Light transmitted through the transparent region may chemically change the photoresist.

The chemical change in the photoresist may depend on a type of photoresist. For a positive photoresist, regions exposed to light become soluble in a developer solution. To the contrary, for a negative photoresist, regions exposed to light become insoluble in the developer solution. The description will exemplarily be given herein of the case of using the positive photoresist.

Following the exposure process, the exposed regions of the photoresist are removed by a developer solution, thereby generating preset photoresist patterns on the thin film.

Afterwards, the thin film is etched to be conformable with the photoresist patterns and the rest of photoresist patterns are then removed, thereby making a preset form of thin film patterns.

In the photolithography process, a linewidth of a circuit or pattern is determined according to wavelength of light used in the exposure process. Considering the current technical standard, it is difficult to form fine patterns less than 70 nm on a substrate through the photolithography process due to light interference.

Further, as patterns are getting supermicronized, an initial investment cost is increased due to an expensive exposure equipment, masks with high resolution are required and the like, resulting in excessively increasing process cost. In addition, since the complicated process, including exposure, baking after exposure, development, baking after development, etching, washing and the like, should be carried out every time forming patterns, it takes a long time to carry out such processes and the photolithography process should be repeated plural times, thereby lowering productivity.

To solve such problems, an imprint lithography and a roll printing have been introduced. The imprint lithography is a method, initially invented by Stephen Chou et al. from the Princeton University in the United States, for carving nano-scaled patterns. According to this method, desired forms are previously made on a surface of inorganic material or polymer with relatively strong intensity and then fine patterns are formed as the previously made forms are affixed onto another material. In detail, an inorganic material or polymer mold having desired fine patterns pre-formed thereon is attached onto a curable composition coated on a metallic film or an organic layer to be thermally cured or photocured, thereby forming patterns. This method has advantages in a simple process and an effective fine pattern formation, compared to the existing photolithography.

The roll printing method has been disclosed, for example, in Korean Patent Application No. 2006-0005482 (Laid Open Application No. 10-2007-76292), entitled "roll printing apparatus and method of fabricating display device using the same." According to the roll printing method, in place of the high resolution mask used when forming patterns through the existing photolithography, silicon polymer and cliché are used to transfer patterns directly on a substrate to desirably form fine patterns thereon, thereby forming the fine patterns.

However, in a low temperature baking process after the fine pattern formation, a problem of disappearance of a metal substrate, which is to be protected upon etching process may be caused by a decrease in adhesive force between an ink composition and a substrate to desirably form patterns thereon. Furthermore, in a high temperature baking process, the adhesive force between the substrate to desirably form patterns thereon and the ink composition is increased but a pattern linewidth and line interval formed by the ink composition runs down to occur deformation, which may cause an excessive defect, for example, defective patterns, resulting in limitation on a consecutive transfer of fine patterns and difficulty in an enhancement of accuracy of the fine patterns.

SUMMARY OF THE INVENTION

Therefore, to solve the problems of the related art, an object of the present invention is to provide an ink composition for an imprint lithography and a roll printing, capable of enhancing pattern accuracy as well as uniformly retaining a linewidth and a line interval of the pattern by using a polymer resin and an additive both endurable even at a high temperature.

The foregoing and other objects, features, aspects and advantages of the present invention will become more apparent from the following detailed description of the present invention when taken in conjunction with the accompanying drawings.

To achieve these and other advantages and in accordance with the purpose of the present invention, as embodied and broadly described herein, there is provided an ink composition consisting of novolak resin; an additive added to retain thermal stability; silicon-based surfactant; hexamethylol melamine hexamethyl ether; and ethanol, wherein the additive is one or more selected from a group consisting of methyl gallate and propyl gallate, and wherein total 100% by weight of the ink composition consist of 7-12.5% by weight of the novolak resin, 7-12.5% by weight of the additive, 71-85.4% by weight of the ethanol, 0.1-1.5% by weight of the silicon-based surfactant and 0.5-2.5% by weight of the hexamethylol melamine hexamethyl ether.

As described above, in the ink composition in accordance with the present invention, polymer resin and additive both endurable even at a high temperature are used so as to constantly maintain pattern linewidth and line interval, which allows consecutive transfer of fine patterns, resulting in improvement of pattern accuracy, yield and process efficiency.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is a table showing comparison results of ink compositions, fabricated using different additives, from first and second embodiments and first and second comparisons;

FIG. 3 is a table showing comparison results of each pattern transcription rate of the ink compositions from the first and second embodiments and the first and second comparisons of FIG. 2;

DETAILED DESCRIPTION OF THE INVENTION

Figure 1:
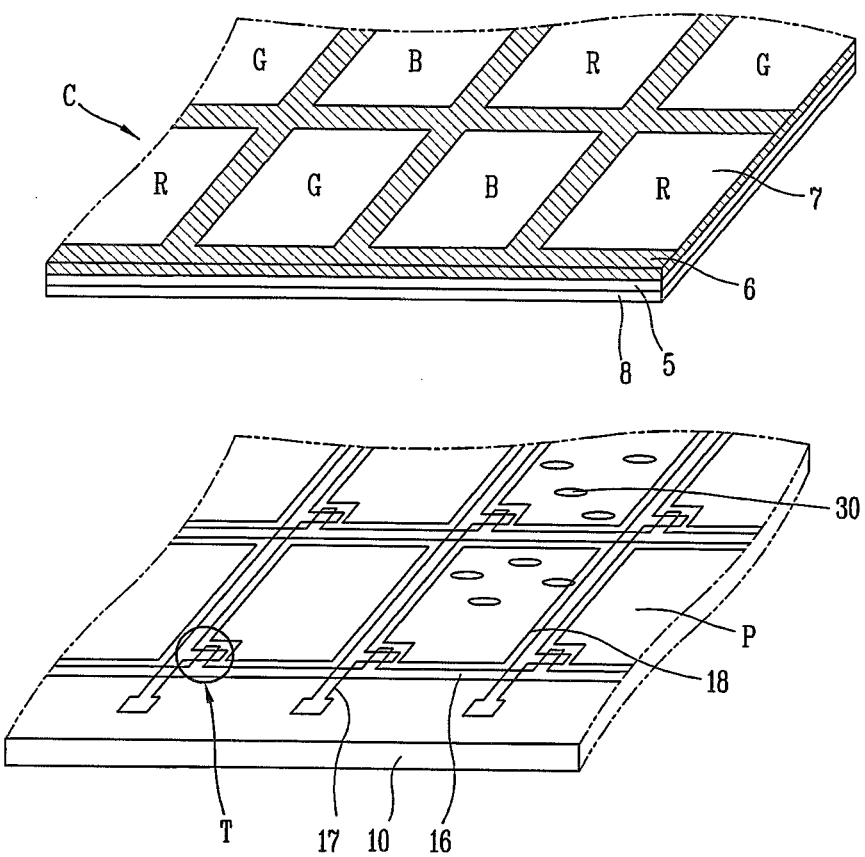
FIG. 1 is a disassembled perspective view schematically showing a related art LCD device.

Description will now be given in detail of an ink composition in accordance with the preferred embodiments of the present invention, with reference to the accompanying drawings.

An ink composition in accordance with the preferred embodiments of the present invention may consist of polymer resin, an additive, an organic solvent, a surfactant, and an adhesive sensitizer. Particularly, the additive, which is capable of retaining thermal stability, is added such that the ink composition can have superior thermal endurance and pattern-forming capability. Also, the addition of the polymer resin and the additive allows an increase in a pattern transcription rate, thereby improving yield and process efficiency.

Here, the polymer resin in accordance with the preferred embodiments of the present invention may include novolak resin, acryl resin and the like which are used for the typical ink composition.

Here, the novolak resin may be a polymer which is compounded by reacting aromatic alcohol, such as meta cresol, para cresol, 2,3,5-trimethylphenol, 2,3-xylene, 3,5-xylene and the like with formaldehyde or paraporeumaldehyde. Also, the acryl resin may be one obtained by polymerizing kareuboksilsan unsaturated, aromatic monomers, acrylic monomers.

The polymer resin may preferably have a molecular weight of 2000-100000, more preferably, 2000-45000.

Preferably, 5-45% by weight of the polymer resin, more preferably, 7-12.5% by weight of the polymer resin may be contained with respect to the total 100% by weight of the composition. Within the range, the polymer resin can serve as a pattern supporter and increase a pattern transcription rate, thus enhancing yield and improving process efficiency.

Also, the additive in accordance with the preferred embodiments of the present invention may serve to control the thermal stability of the ink composition. Examples of the additive may include pentaerythritol, methyl gallate, propyl gallate, lauryl gallate, octylgallate, metol, tyramine hydrochloride, 1-(3-hydroxyphenyl)piperazine, 4-bromo-2-(5-isoxazolyl)phenol, 4-(imidazole-1-yl)phenol, apigenin, 2-(4,5-dihydro-1H-imidazole-2-yl)phenol, 3-(4,5-dihydro-1H-imidazole-2-yl)phenol, 4-(4,5-dihydro-1H-imidazole-2-yl)phenol, 4-nitro-2-(1H-pyrazole-3-yl)phenol, 2-(2- hydroxyphenyl)-1H-benzimidazole, 4-(4-methyl-4,5-dihydro-1H-imidazole-2-yl)phenol, 1-amino-2-naphthol hydrochloride, 2,4-diamino phenol dihydrochloride, 2-acetamidophenol, 2-amino-3-nitrophenol, 2-amino-4-chloro-5-nitrophenol, 2-amino-5-nitrophenol, 3-amino-2-naphthol, 3-methoxytyramine hydrochloride, 4,7-dimethoxy-1,10-phenanthroline, 4-amino-1-naphthol hydrochloride, 4-amino-3-chlorophenol hydrochloride, 4-aminophenol hydrochloride, 4-tritylphenol, 8-amino-2-naphthol, biochanin A, chloranil, pentaBromo-phenol, quercetin dihydrate, fisetin, 1,3,5-trimethyl-2,4,6-tris(3,5-di-tert-butyl-4-hydroxybenzyl)benzene, tris(3,5-di-tert-butyl-4-hydroxybenzyl)isocyanurate, octadecyl-3-(3,5-di-tert-butyl-4-hydroxyphenyl)propionate, 2,5-bis(1,1-dimethylpropyl)-1,4-benzenediol, 1,1,3-tris-(2-methyl-4-hydroxy-5-tert-butylphenyl)butane, triethyleneglycol-bis(3-tert-butyl-4-hydroxy-5-methylphenyl)propionate, 2,2-methylenebis(4-methyl-6-(1-methylcyclohexyl)-phenol), tris(2,4-di-tert-butylphenyl)phosphate and the like.

Here, preferably, 5-45% by weight of the additive may be contained in the ink composition of the present invention, more preferably, 7-12.5% by weight of the additive may be contained in the ink composition. Within the range, the linewidths and line intervals of patterns are allowed to be constantly maintained, so as to improve accuracy of the patterns, which are to be desirably formed on a substrate, resulting in enhancement of yield and process efficiency.

The organic solvent in accordance with the preferred embodiments of the present invention may be an easily soluble solvent, which is useable, if necessary, in addition to the polymer resin and the additive.

For instance, the organic solvent may be a single solvent or a mixture of two or more types of solvents selected from the following solvents, examples of which may include acrylonitrile, acetonitrile, glycerol, dimethyl sulfoxide, nitromethane, dimethylformamide, phenol, N-methylpyrrolidone, pyridine perfluorotributylamine, perfluorodecalin, 2-butanone, methylene carbonate, types of alcohols including methanol, ethanol, ethylene glycol, triethyleneglycol, tetraethylene glycol, propylene glycol, propylene ethylene glycol, diethylene glycol, butanediol, benzyl alcohol, hexyl alcohol, allyl alcohol and the like, types of ethers including propylene carbonate, tetrahydrofuran, methoxy benzene, 1,4-dioxane, 1-methoxy-2-propanol, dibutyl ether, diphenyl ether and the like, types of esters including ethyl acetate, methyl acetate, propyl acetate, butyl actate, ethylpropion, ethylester, butyl ester, methyl-2-hydroxyisobutyrate, 2-methoxy-1-methylethyl ester, 2-methoxyethanol acetate, 2-ethoxyethanol acetate and the like, type of ethylene glycol alkyl ether acetates including ethylene glycol methyl ether acetate, ethylene glycol ethyl ether acetate and the like, types of ethylene glycol alkyl ether propionates including ethylene glycol methyl ether propionate, ethylene glycol ethyl ether propionate and the like, types of ethylene glycol monoalkyl ethers including ethylene glycol methyl ether, ethylene glycol ethyl ether and the like, types of diethylene glycol alkyl ethers including diethylene glycol monomethyl ether, diethylene glycol monoethyl ether, diethylene glycol dimethyl ether, diethylene glycol methyl ethyl ether and the like, types of propylene glycol alkyl ether acetates including propylene glycol methyl ether acetate, propylene glycol ethyl ether acetate, propylene glycol propyl ether acetate and the like, types of propylene glycol alkyl ether propionates including propylene glycol methyl ether propipnate, propylene glycol ethyl ether propionate, propylene glycol propyl ether propionate and the like, types propylene glycol monoalkyl ethers including propylene glycol methyl ether, propylene glycol ethyl ether, propylene glycol propyl ether, propylene glycol butyl ether and the like, types of dipropylene glycol alkyl ethers including dipropylene glycol dimethyl ether, dipropylene glycol diethyl ether and the like, types of butylene glycol monomethyl ethers including butylene glycol monomethyl ether, butylene glycol monoethyl ether and the like, and types of dibutylene glycol alkyl ethers including dibutylene glycol dimetyl ether, dibutylene glycol diethyl ether and the like. Particularly, in order to grant an enhanced coating performance to silicon polymer, it is advantageous for pattern transcription to use the mixture of more then two types of the organic solvents, other than a single solvent.

The 50-90% by weight of the organic solvent may be preferably contained in the ink composition, more preferably, 70-80% by weight of the organic solvent may be contained in the ink composition. Within the range, the organic solvent may contribute to the process efficiency as well as to the solubility.

Here, the surfactant may prevent stains of ink material and hole marks which may occur on the silicon polymer, and ensure better coating performance.

Examples of the surfactant may include a silicon-based surfactant or a fluorine-based surfactant such as perfluoroalkyloligomer, and the content of the surfactant may occupy 0.01-3% by weight, preferably, 0.1-1.5% by weight of the total 100% by weight of the ink composition.

Also, the adhesive sensitizer may be used for improving the property of adhesion to a lower layer, example of which may include a typical melanin crosslinking agent.

Examples of the melanin crosslinking agent may include a condensation product of urea and formaldehyde, a condensation product of melamine and formaldehyde, a type of methylol urea alkyl ether or a type of methylol melamine alkyl ether obtained from alcohol. For example, examples of the condensation product of urea and formaldehyde may include monomethylol urea, dimethylol urea and the like. An example of the condensation product of melamine and formaldehyde may include hexamethylol melamine. Also, part of the condensation product of the melamine and formaldehyde may also be used as the melanin crosslinking agent. The type of methylol urea alkyl ether may be obtained by reaction among the condensation product of urea and formaldehyde, part or all of methylol group and alcohol. Examples of the types of methylol urea alkyl ethers may include monomethyl urea methyl ether, dimethyl urea methyl ether and the like. The type of methylol melamine alkyl ether may be obtained by reaction among the condensation product of melamine and formaldehyde, part or all of methylol group and alcohol. Examples of the types of methylol melamine alkyl ethers may include hexa methylol melamine hexa methyl ether, hexa methylol melamine hexa butyl ether and the like. A compound in a structure that hydrogen atom of amino group of melamine is replaced with hydroxymethyl group and methoxymethyl group, a compound in a structure that hydrogen atom of amino group of melamine is replaced with butoxymethyl group and methoxymethyl group and the like may also be employed. Especially, the type of methylol melamine alkyl ether may be preferably used.

The content of the adhesive sensitizer, if used, may preferably be 0.01-5% by weight, more preferably, 0.5-2.5% by weight of the total 100% by weight of the composition. Within the range, the ink composition in accordance with the preferred embodiments of the present invention can have superior adherence with a lower substrate, and may serve to later protect a metal layer, located at a lower portion of a pattern during an etching process.

The ink composition in accordance with the preferred embodiments of the present invention having such configuration may be applied to a pattern formation by use of an imprint lithography and a roll printing, so as to allow fine patterns to be accurately formed on a substrate.

Particularly, the ink composition in accordance with the preferred embodiments of the present invention may include polymer resin and additive both endurable even at a high temperature of about 90-250° C., thereby ensuring superior transcription rate of fine patterns and allowing accurate formation of fine patterns. Such improved properties will now be described in detail in comparison with comparison examples (hereinafter, referred to as 'comparison').

FIG. 2 is a table showing comparison results of ink compositions, fabricated using different additives, from first and second embodiments and first and second comparisons, wherein unit is percent by weight.

As shown in FIG. 2, it is represented that for the respective ink compositions of the first and second embodiments and the first and second comparisons, novolak resin, ethanol, silicon group and hexamethylol melamine hexamethyl ether were used respectively as polymer resin, organic solvent, surfactant and adhesive sensitizer, for each of which methyl gallate, propyl gallate, 2,4-dimethylphenol and rosin were used as additives.

Here, total 100% by weight of each ink composition of the first and second embodiments and the first and second comparisons may consist of 10.0% by weight of polymer resin, 10.0% by weight of additive, 80.0% by weight of organic solvent, 1.0% by weight of surfactant and 3.0% by weight of adhesive sensitizer.

By use of the fabricated ink compositions of the first and second embodiments and the first and second comparisons, various properties thereof were estimated by the following method.

First, each ink composition of the first and second embodiments and the first and second comparisons was coated on silicon polymer with no pattern, and naturally dried for 10 seconds. Fine patterns were transferred on a target substrate while the silicon polymer rolled on a cliché. The transcription rate of the thusly obtained patterns was then measured.

FIG. 3 is a table showing comparison results of each pattern transcription rate of the ink compositions from the first and second embodiments and the first and second comparisons of FIG. 2, wherein the pattern transcription rate is represented in the range of 0~100% according to whether patterns have been formed in 100 cells each having 1×1 mm in size.

As shown in FIG. 3, the first and second embodiments showed 98% and 97% of pattern transcription rates, respectively, whereas the first and second comparisons showed 85% and 79% of pattern transcription rates.

That is, it was exhibited that each ink composition of the first and second embodiments using the additives with high thermal resistance showed more than 97% of superior pattern transcription rate.

In the meanwhile, in order to measure accuracy of fine patterns formed, each ink composition of the first and second embodiments and the first and second comparisons was coated on silicon polymer with no pattern, and naturally dried for a preset time. Fine patterns were transferred on the target substrate while the silicon polymer rolled on a cliché. After the fine patterns-transcribed substrate was thermally treated at a high temperature of 200° C. for 3 minutes, the accuracy of the pattern formation was checked by use of an optical microscope. The checked results can be seen in FIGS. 4 to 7.

Figure 4:
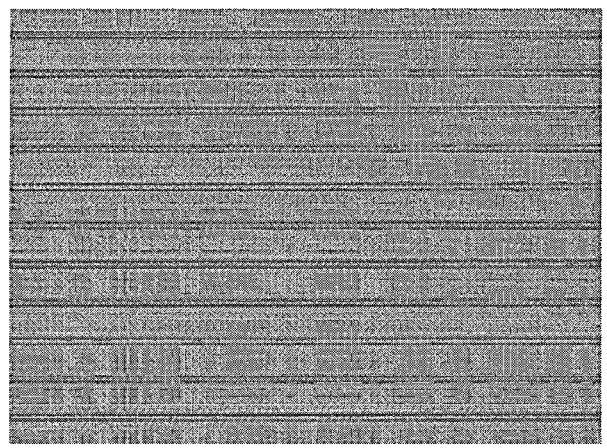
FIG. 4 is an optical microscopic photo showing a heat-treated surface of a fine pattern formed by using the ink composition fabricated in accordance with the first embodiment of the present invention.
Figure 5:
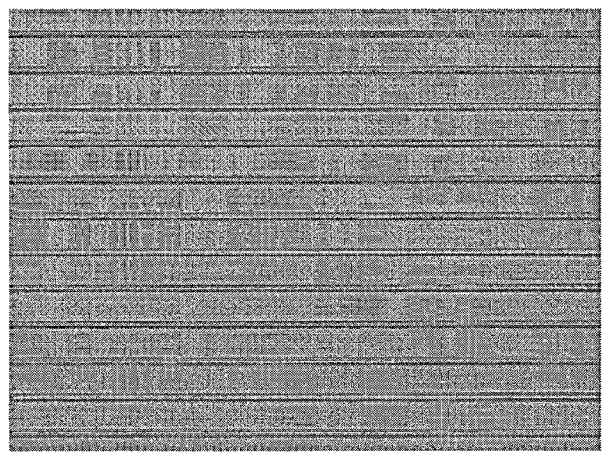
FIG. 5 is an optical microscopic photo showing a heat-treated surface of a fine pattern formed by using the ink composition fabricated in accordance with the second embodiment of the present invention.
Figure 6:
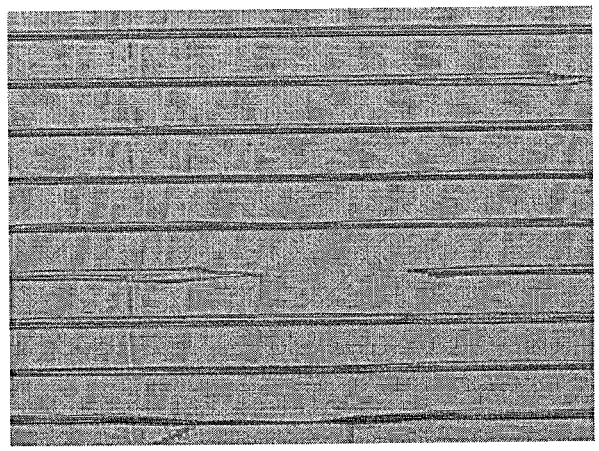
FIG. 6 is an optical microscopic photo showing a heat-treated surface of a fine pattern formed by using the ink composition fabricated in accordance with the first Comparison.
Figure 7:
FIG. 7 is an optical microscopic photo showing a heat-treated surface of a fine pattern formed by using the ink composition fabricated in accordance with the second Comparison.

FIGS. 4 and 5 are optical microscopic photos each showing a thermally treated surface of a fine pattern formed by using the ink compositions each fabricated from the first and second embodiments according to the present invention. FIGS. 6 and 7 are optical microscopic photos each showing a thermally treated surface of a fine pattern formed by using the ink compositions each fabricated from the first and second comparisons according to the present invention.

As shown in FIGS. 4 and 5, patterns are uniformly formed upon using each ink composition according to the first and second embodiments of the present invention. Accordingly, no pattern linewidth is changed before and after the thermal treatment, which thusly exhibits superior accuracy of the pattern formation.

To the contrary, as shown in FIGS. 6 and 7, upon using each ink composition fabricated in the first and second comparisons, a drastic change in the pattern linewidth can be observed before and after the thermal treatment, which thusly exhibits inaccuracy of the pattern formation.

The ink compositions having such properties in accordance with the embodiments of the present invention can be used for an imprint lithography and a roll printing, so as to allow forming of fine patterns, which are applied to information storage, compact sensors, photonic crystal and optical devices, micro-electro mechanical systems, display devices and semiconductors, which will hereinafter be described in detail through an exemplary method for fabricating an LCD device.

Figure 8:
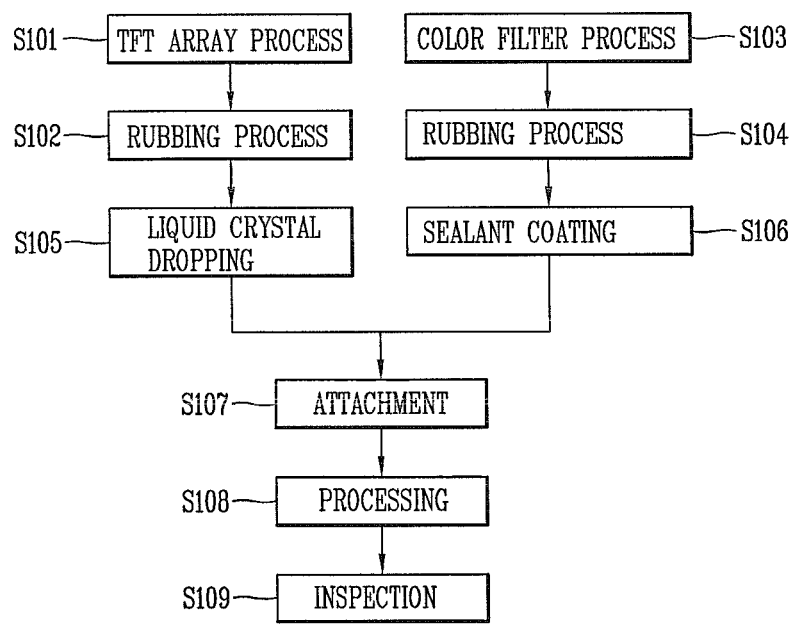
FIG. 8 is a flowchart sequentially showing a method of fabricating an LCD device using an ink composition in accordance with the present invention.

FIG. 8 is a flowchart sequentially showing a method of fabricating an LCD device using an ink composition in accordance with the present invention, which shows a method for fabricating an LCD device in case of forming a liquid crystal layer by a liquid crystal dropping method. However, the present invention may not be limited to this method, but also applicable to a method for fabricating an LCD device in case of forming a liquid crystal layer by a liquid crystal injection method.

The fabrication process of the LCD device may be divided into a switching device array process of forming switching devices on a lower array substrate, a color filter process of forming color filters on an upper color filter substrate, and a cell process.

Through an array process, a plurality of gate lines and data lines, which are arranged on the lower substrate to define pixel regions, and thin film transistors (TFTs) as switching devices connected to the gate lines and data lines are formed respectively at the pixel regions (S101). Also, through the array process, a pixel electrode, which is connected to the TFTs for driving a liquid crystal layer responsive to a signal being applied via the TFTs, is formed.

Also, a color filter layer provided with red, green and blue sub filters rendering colors and a common electrode are formed on the upper substrate through the color filter process (S103).

Here, various fine patterns are formed through the array process and the color filter process. Upon the patterns being formed, an imprint lithography and a roll printing using the ink compositions according to the embodiment of the present invention may be used, which will hereinafter be described in detail with reference to the drawings.

Meanwhile, the lower substrate and the upper substrate each are configured as a large mother substrate. In other words, a plurality of panel regions are formed on the large mother substrates, and the TFT as the switching device and the color filter layer are formed at each panel region.

FIGS. 9A to 9D are sectional views sequentially showing a process of forming ink patterns using an ink composition in accordance with the present invention, in which a roll printing process is exemplarily described. However, the present invention may not be limited to the roll printing process, but also applicable to forming ink patterns through the imprint lithography.

Figure 9A:
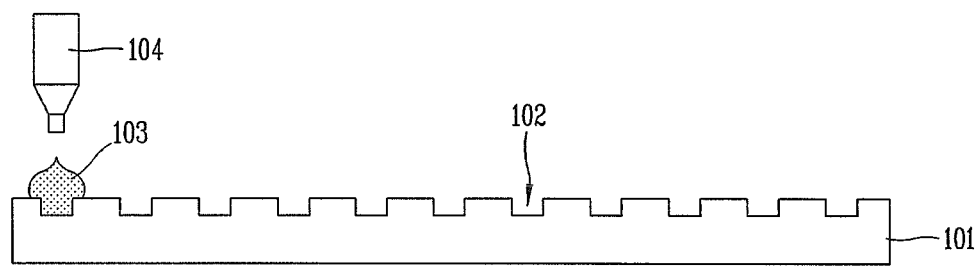
FIGS. 9A to 9D are sectional views sequentially showing a process of forming ink patterns using the ink composition in accordance with the present invention.

As shown in FIG. 9A, a printing plate 101 having printing grooves 102, which substantially have the same patterns to target ink patterns is prepared. An ink 103 containing solvent is then provided on the printing plate 101 from an ink feeder 104.

Although not shown in detail in the drawings, a roll printing apparatus is used for printing various ink patterns on a target substrate, and includes the printing plate 101, the ink feeder 104 for providing the ink 103 on the printing plate 101, and a transfer roller provided with a transfer sheet for transferring the ink 103 filled in the printing plate 101 onto the target substrate.

Here, the printing plate 101 is provided with a plurality of printing grooves 102 for forming target ink patterns on an upper surface thereof, and each of the printing grooves 102 may substantially have the same shape to the target ink pattern.

The ink feeder 104 then coats the ink 103 on the printing plate 101 with a thickness of 0.5-10 μm by employing an appropriate method, for example, spin coating, roller coating, slit coating and the like.

Here, the ink composition composing the ink 103 according to the embodiments of the present invention may consist of novolak resin, an additive added to retain thermal stability, silicon-based surfactant, hexamethylol melamine hexamethyl ether and ethanol, wherein the additive is one or more selected from a group consisting of methyl gallate and propyl gallate, and wherein total 100% by weight of the ink composition consist of 7-12.5% by weight of the novolak resin, 7-12.5% by weight of the additive, 71-85.4% by weight of the ethanol, 0.1-1.5% by weight of the silicon-based surfactant and 0.5-2.5% by weight of the hexamethylol melamine hexamethyl ether. The added additive can also increase a pattern transcription rate so as to improve yield and process efficiency.

Figure 9B:
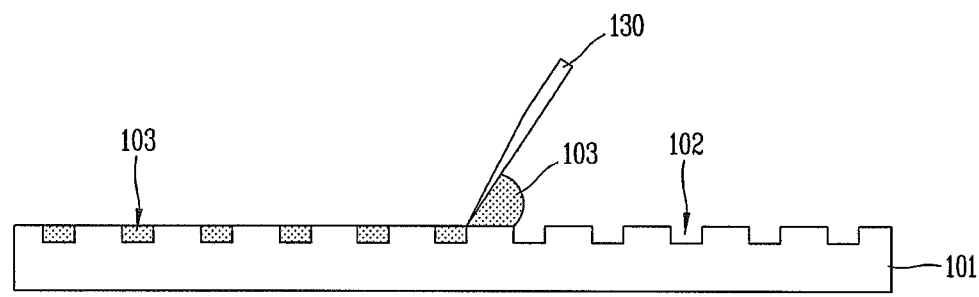

Next, as shown in FIG. 9B, the ink 103 coated on the printing plate 101 is filled in each printing groove 102 by using a blade 130. That is, if the blade 130 is placed on the printing plate 101 provided with the ink 103 and moved in one direction in a contact state with the upper surface of the printing plate 101, the ink 103 provided on the upper surface of the printing plate 101 is squeezed in the proceeding direction to be filled in the printing grooves 102. Also, the ink 103 on the upper surface of the printing plate 101 excluding the printing grooves 102 is removed by the blade 130. Here, a removal blade (not shown) for completely removing the remnant ink 103 on the upper surface of the printing plate 101 may further be provided.

Figure 9C:
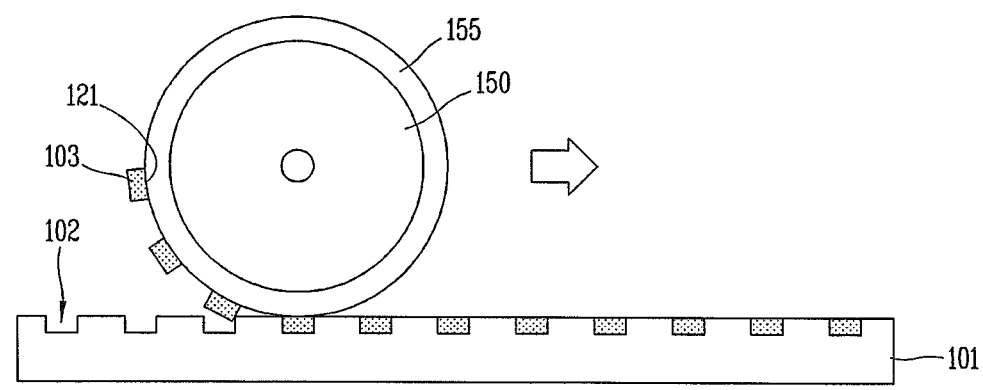

As shown in FIG. 9C, a transfer roller 150 having a transfer sheet 155 is rolled on the upper surface of the printing plate 101 filled with the ink 103. Accordingly, the ink 103 filled in the printing grooves 102 is transferred onto the transfer sheet 155 of the transfer roller 150.

The transfer roller 150 may be formed, for example, in a cylindrical shape, and its outer surface is covered with the transfer sheet 155. The transfer sheet 155 may be formed of a material, which has an excellent adhesive property with the ink 103, for example, silicon with excellent hydrophilicity. Also, the transfer sheet 155 may have elasticity so as to facilitate ink transfer from the printing plate 101 and ink re-transfer onto the target substrate.

Figure 9D:
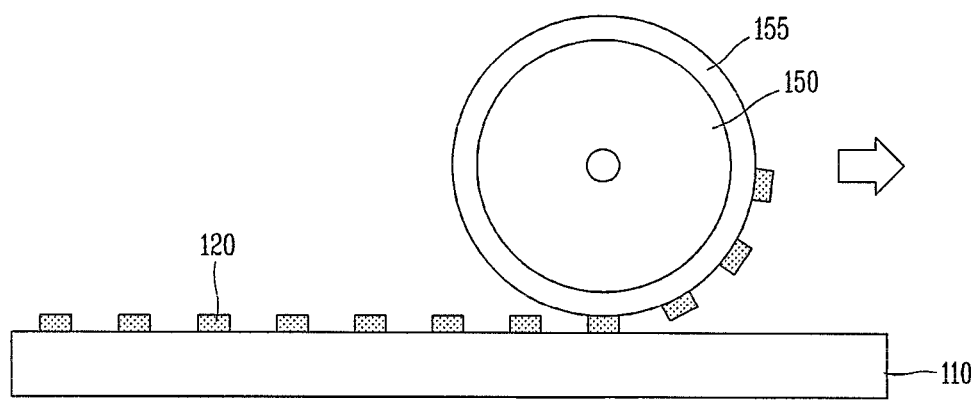

As shown in FIG. 9D, the transfer roller 150 is then rolled in one direction to retransfer the ink 103, which has been transferred on the transfer sheet 155, onto the target substrate 110, thereby forming preset ink patterns 120.

Here, an interval between the transfer roller 150 and a lower frame (not shown) may be adjustable such that the transfer sheet 155 covering the transfer roller 150 can contact the upper surface of the target substrate 110 while the transfer roller 150 is rotated. Here, the transfer sheet 155 of the transfer roller 150 does not have to certainly contact the upper surface of the target substrate 110. However, a distance, which is at least as short as the ink transferred onto the transfer sheet 155 from the printing plate 101 can contact the upper surface of the target substrate 110, should be maintained.

Afterwards, although not shown in the drawings, it may also be possible to conduct a photocuring process using ultraviolet, a thermosetting process of performing a thermal treatment at a temperature of 90-200° C., or a combination of the photocuring and the thermosetting processes. Here, the thermal treatment is performed to evaporate solvent without pyrolyzing solid component contained in the ink composition. Typically, it is preferable to minimize the concentration of the solvent through the thermal treatment and execute the thermal treatment until an ink layer with thickness less than 10 μm is left on a substrate.

Such a process may enhance adhesive property and chemical resistance between the ink layer and the substrate. The process-completed substrate is then treated with an etching solution or gaseous plasma so as to process an exposed portion of the substrate. Here, the non-exposed portion of the substrate is protected by the ink layer. After the treatment of the substrate, the ink layer is removed by an appropriate stripper, thereby forming fine patterns on the substrate.

Afterwards, an alignment layer is printed on each of the upper substrate and the lower substrate. The alignment layers are aligned with each other so as to provide an anchoring force or surface anchoring characteristics (that is, pretilt angle and alignment direction) to liquid crystal molecules of a liquid crystal layer interposed between the upper substrate and the lower substrate.

In case of employing a dropping method, preset seal patterns are formed on the color filter substrate by use of sealant and simultaneously a liquid crystal layer is formed on the array substrate (S105 and S106) (see FIG. 8).

In the dropping method, liquid crystal is dropped and dispensed through a dispenser on an image display region either of a first large mother substrate having a plurality of array substrates or a second large mother substrate having a plurality of color filter substrates, and the liquid crystal is uniformly distributed all over the image display region by pressure of attaching the first and second mother substrates, thereby forming the liquid crystal layer.

Therefore, upon forming the liquid crystal layer on an LCD panel through the dropping method, the seal patterns should be formed in form of a closed pattern covering the periphery of each pixel region such that the liquid crystal cannot be leaked out of the image display region.

Upon employing the dropping method, liquid crystal may be dropped within a short time, compared to employing a vacuum injection method, and also the liquid crystal layer can be formed very fast even if the LCD panel becomes larger.

Also, since liquid crystal is dropped on a substrate as much as being needed upon employing the dropping method, an increase in fabricating cost of the LCD panel due to discard of high-priced liquid crystal can be prevented, resulting in strengthening competitiveness of products.

Afterwards, referring back to FIG. 8, in a state where the upper substrate and the lower substrate on which the liquid crystal is dropped and the sealant is coated are aligned with each other, pressure is applied so as to attach the lower substrate and the upper substrate by the sealant and simultaneously to render the dropped liquid crystal distributed all over the panel (S107). Through the process, a plurality of LCD panels having the liquid crystal are formed on the large mother substrate (lower substrate and upper substrate). The glass substrate is then processed and cut into the plurality of LCD panels. Each of the LCD panels is then inspected so as to complete the fabrication of the LCD device (S108 and S109).

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An ink composition consisting of:
   7-12.5% by weight of a novolak resin;
   7-12.5% by weight of an additive added to retain thermal stability selected from the group consisting of methyl gallate and propyl gallate;
   0.1-1.5% by weight of a silicon-based surfactant;
   0.5-2.5% by weight of hexamethylol melamine hexamethyl ether; and
   71-85.4% by weight ethanol,
   wherein the amounts are based on the total of the ink composition.

2. The ink composition of claim 1, wherein based on the total of the ink composition:
   the novolak resin is 10.0% by weight;
   the additive is 10.0% by weight;
   ethanol of 76.0% by weight;
   silicon-based surfactant is 1.0% by weight; and
   hexamethylol melamine hexamethyl ether is 3.0% by weight.

3. The ink composition of claim 1, wherein the ink composition is used for forming patterns using an imprint lithography or a roll printing.

* * * * *